United States Patent
Dede et al.

(10) Patent No.: US 10,121,729 B2
(45) Date of Patent: Nov. 6, 2018

(54) POWER ELECTRONICS ASSEMBLIES HAVING A SEMICONDUCTOR DEVICE WITH METALLIZED EMBEDDED COOLING CHANNELS

(71) Applicants: Toyota Motor Engineering & Manufacturing North America, Inc., Erlanger, KY (US); Toyota Jidosha Kabushiki Kaisha, Aichi-ken (JP)

(72) Inventors: Ercan M. Dede, Ann Arbor, MI (US); Kyosuke Miyagi, Ann Arbor, MI (US); Yuji Fukuoka, Northville, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 0 days.

(21) Appl. No.: 15/218,801

(22) Filed: Jul. 25, 2016

(65) Prior Publication Data
US 2018/0025962 A1    Jan. 25, 2018

(51) Int. Cl.
| H01L 23/34 | (2006.01) |
| H01L 23/46 | (2006.01) |
| H01L 29/16 | (2006.01) |
| H01L 29/20 | (2006.01) |

(52) U.S. Cl.
CPC .......... *H01L 23/46* (2013.01); *H01L 29/1602* (2013.01); *H01L 29/1608* (2013.01); *H01L 29/2003* (2013.01)

(58) Field of Classification Search
CPC . H01L 23/46; H01L 29/1602; H01L 29/2003; H01L 29/1608
See application file for complete search history.

(56) References Cited

U.S. PATENT DOCUMENTS

| 7,002,801 | B2 | 2/2006 | Zeighami et al. |
| 7,139,172 | B2 | 11/2006 | Bezama et al. |
| 7,781,263 | B2 | 8/2010 | Winter et al. |
| 7,916,480 | B2 | 3/2011 | Woody et al. |
| 8,232,637 | B2 | 7/2012 | Beaupre et al. |
| 8,358,000 | B2 | 1/2013 | Beaupre et al. |
| 8,929,071 | B2 | 1/2015 | Beaupre et al. |
| 8,987,892 | B2 * | 3/2015 | Davis .............. H01L 23/3735 257/712 |
| 2005/0245025 | A1 * | 11/2005 | Kudelka .............. C25F 3/12 438/243 |
| 2006/0042825 | A1 * | 3/2006 | Lu .............. H01L 23/427 174/252 |
| 2007/0063337 | A1 * | 3/2007 | Schubert .............. H01L 23/473 257/714 |

(Continued)

Primary Examiner — Ismail Muse
(74) Attorney, Agent, or Firm — Dinsmore & Shohl LLP (57) ABSTRACT

A power electronics assembly having a semiconductor device that includes a first device surface opposite a second device surface, a semiconductor substrate layer that extends from the first device surface to a substrate-drift interface, a semiconductor drift layer that extends from the substrate-drift interface towards the second device surface, and a semiconductor fluid channel is positioned within the semiconductor substrate layer of the semiconductor device. Further, the semiconductor fluid channel includes an inner surface. Moreover, a fluid channel metallization layer is positioned along the inner surface of the semiconductor fluid channel.

16 Claims, 5 Drawing Sheets

(56) References Cited

U.S. PATENT DOCUMENTS

| | | | |
|---|---|---|---|
| 2008/0233285 A1* | 9/2008 | Das | H01L 21/02236 427/248.1 |
| 2012/0119862 A1* | 5/2012 | Franklin | A23D 9/007 336/58 |
| 2013/0223010 A1* | 8/2013 | Shioga | H01L 23/13 361/700 |
| 2015/0162366 A1* | 6/2015 | Oganesian | H01L 27/1446 257/433 |
| 2015/0251280 A1* | 9/2015 | Bunker | C23C 4/00 29/402.18 |
| 2015/0270356 A1* | 9/2015 | Palacios | H01L 21/02458 257/76 |
| 2016/0028154 A1* | 1/2016 | Baek | H01Q 1/526 343/720 |
| 2016/0260658 A1* | 9/2016 | Schneegans | H01L 21/4807 |
| 2016/0365300 A1* | 12/2016 | Gupta | H01L 23/473 |
| 2016/0380018 A1* | 12/2016 | Oganesian | H01L 27/14618 438/125 |
| 2017/0025530 A1* | 1/2017 | Cooper, Jr. | H01L 29/7816 |
| 2017/0133298 A1* | 5/2017 | Gutala | G01K 7/343 |

* cited by examiner

POWER ELECTRONICS ASSEMBLIES HAVING A SEMICONDUCTOR DEVICE WITH METALLIZED EMBEDDED COOLING CHANNELS

TECHNICAL FIELD

The present specification generally relates to power electronics assemblies, and more particularly, to power electronics assemblies having semiconductor device stacks with semiconductor devices and an integrated fluid channel system extending within the semiconductor device stacks.

BACKGROUND

Heat sinking devices may be coupled to a heat generating device, such as a power electronics device, to remove heat and lower the maximum operating temperature of the heat generating device. Cooling fluid may be used to receive heat generated by the heat generating device by convective thermal transfer, and remove such heat from the heat generating device. For example, a jet of cooling fluid may be directed such that it impinges a surface of the heat generating device. Another way to remove heat from a heat generating device is to couple the device to a finned heat sink made of a thermally conductive material, such as aluminum.

However, as power electronics are designed to operate at increased power levels and generate increased corresponding heat flux due to the demands of newly developed electrical systems, conventional heat sinks are unable to adequately remove the heat flux to effectively lower the operating temperature of the power electronics to acceptable temperature levels. Further, conventional heat sinks and cooling structures require additional bonding layers and thermal matching materials (e.g., bond layers, substrates, thermal interface materials). These additional layers add substantial thermal resistance to the overall assembly and make thermal management of the electronics system challenging.

Accordingly, a need exists for alternative power electronics assemblies and power electronics devices having internal cooling structures.

SUMMARY

In one embodiment, a power electronics assembly includes a semiconductor device. The semiconductor device includes a first device surface opposite a second device surface, a semiconductor substrate layer extends from the first device surface to a substrate-drift interface, a semiconductor drift layer extends from the substrate-drift interface towards the second device surface, and a semiconductor fluid channel is positioned within the semiconductor substrate layer of the semiconductor device. Further, the semiconductor fluid channel includes an inner surface. Moreover, a fluid channel metallization layer is positioned along the inner surface of the semiconductor fluid channel.

In another embodiment, a power electronics assembly includes a semiconductor device stack. The semiconductor device stack includes a semiconductor device, a first electrode electrically and thermally coupled to a first device surface of the semiconductor device, and a second electrode electrically and thermally coupled to a second device surface of the semiconductor device. A substrate layer is coupled to the semiconductor device stack and the substrate layer includes a substrate inlet port and a substrate outlet port. The power electronics assembly also includes an integrated fluid channel system that extends between the substrate inlet port and the substrate outlet port of the substrate layer. The integrated fluid channel system includes a substrate fluid inlet channel extending from the substrate inlet port into the substrate layer, a substrate fluid outlet channel extending from the substrate outlet port into the substrate layer, and a semiconductor fluid channel extending into the semiconductor device and positioned in fluid communication with the substrate fluid inlet channel and the substrate fluid outlet channel. The semiconductor fluid channel further includes an inner surface. Moreover, the power electronics assembly includes a fluid channel metallization layer positioned along the inner surface of the semiconductor fluid channel of the semiconductor device.

In yet another embodiment, a method of manufacturing a power electronics assembly includes etching a semiconductor fluid channel into a semiconductor device. The semiconductor device includes a first device surface and a second device surface and the semiconductor fluid channel includes an inner surface. The method further includes disposing a fluid channel metallization layer onto the inner surface of the semiconductor fluid channel, coupling a first electrode to the first device surface of the semiconductor device, and positioning the semiconductor device into fluid communication with a substrate layer. Further, the substrate layer includes a substrate fluid inlet channel extending from a substrate inlet port into the substrate layer and a substrate fluid outlet channel extending from a substrate outlet port into the substrate layer. Moreover, the substrate fluid inlet channel and the substrate fluid outlet channel are each in fluid communication with the semiconductor fluid channel.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Referring generally to the figures, embodiments of the present disclosure are directed to power electronics assemblies comprising a substrate layer and one or more semiconductor stacks. The semiconductor stacks each include one or more semiconductor devices and one or more electrodes electrically coupled to the semiconductor devices. The power electronics assemblies of the present disclosure further include an integrated fluid channel system comprising cooling channels extending within various components of the power electronics assemblies, for example, into the substrate layer, the electrodes, the semiconductor devices, or combinations thereof. Further, semiconductor fluid channels extending within the semiconductor devices may include fluid channel metallization layers positioned along inner surfaces of the semiconductor fluid channels. In operation, dielectric cooling fluid may be circulated through the integrated fluid channel system to remove heat from the power electronics device, for example, the semiconductor device. The semiconductor fluid channels positioned directly within the semiconductor device facilitate heat removal at the heat source, for example, the semiconductor device, lowering the thermal resistance created by intervening structure between the heat source and the dielectric cooling fluid. Moreover, the fluid channel metallization layer may lower the electrical on-resistance within the semiconductor device caused by the semiconductor fluid channels, maintaining or even improving the electrical performance of the semiconductor device while simultaneously improving heat removal from the semiconductor device.

Figure 1:
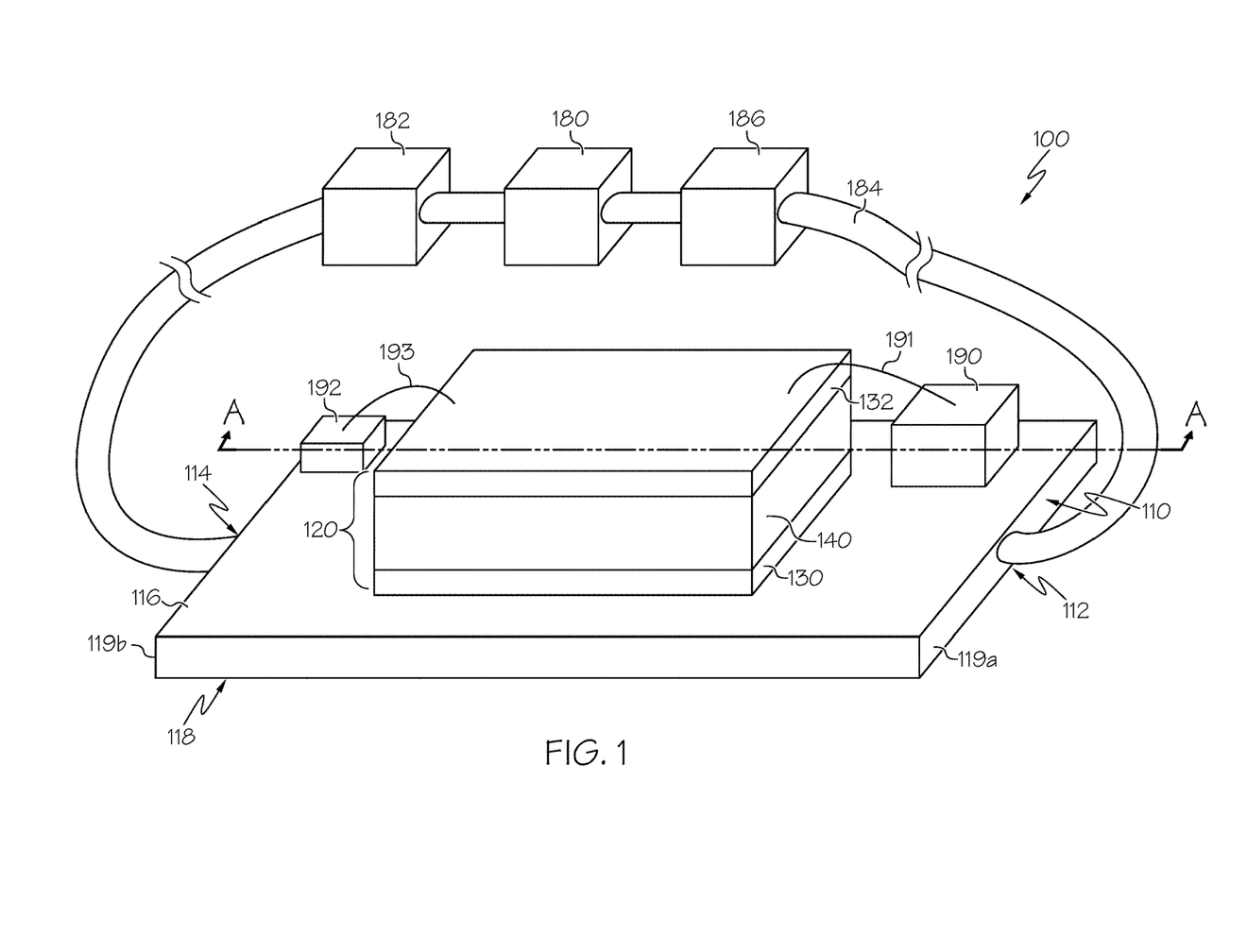
FIG. 1 schematically depicts an example power electronics assembly having a semiconductor device, according to one or more embodiments shown and described herein.

Referring to FIGS. 1-5, an example power electronics assembly 100 comprising a semiconductor device stack 120 coupled to a substrate layer 110 is schematically depicted. FIG. 1 depicts a perspective view of the power electronics assembly 100 and FIGS. 2-5 depict a cross-sectional view of embodiments of the power electronics assembly 100 along line A-A of FIG. 1. As depicted in FIGS. 2-5, the power electronics assembly 100 includes an integrated fluid channel system 150 extending within the substrate layer 110 and at least a portion of the semiconductor device stack 120. The integrated fluid channel system 150 provides a fluid flowpath extending within the substrate layer 110 and the semiconductor device stack 120 such that a dielectric cooling fluid may be circulated through the substrate layer 110 and the semiconductor device stack 120 to remove heat from one or more semiconductor devices 140 of the semiconductor device stack 120. Example, non-limiting dielectric cooling fluids include R-245fa and HFE-7100. Other dielectric cooling fluids may be utilized. The type of dielectric cooling fluid chosen may depend on the operating temperature of the heat generating devices to be cooled.

The illustrated substrate layer 110 of the power electronics assembly 100 may comprise any substrate material, for example a high temperature co-fired ceramic (HTCC) material, a low temperature co-fired ceramic (LTCC) material, FR-4, or the like. The substrate layer 110 may comprise a high temperature substrate layer such as HTCC, that is compositionally configured to withstand a temperature greater than or equal to about an operating temperature of the semiconductor device 140 without substantially deforming or otherwise deteriorating, for example, temperatures greater than about 250° C., 280° C., 300° C., 320° C., 350° C., or the like. As depicted in FIG. 1, the substrate layer 110 comprises a device facing surface 116 opposite a base surface 118. Further, the substrate layer 110 comprises one or more substrate sidewalls 119 extending around a perimeter of the substrate layer 110 between the device facing surface 116 and the base surface 118.

The substrate layer 110 comprises a substrate inlet port 112 and a substrate outlet port 114. The substrate inlet port 112 and the substrate outlet port 114 may each extend into the one or more substrate sidewalls 119, as depicted in FIGS. 1-5. For example, the substrate inlet port 112 may extend into the first substrate sidewall 119a and the substrate outlet port 114 may extend into the second substrate sidewall 119b. In a non-limiting example, one or both of the substrate inlet port 112 and the substrate outlet port 114 may extend into the base surface 118 of the substrate layer 110. In another, non-limiting example, one or both of the substrate inlet port 112 and the substrate outlet port 114 may extend into the device facing surface 116 of the substrate layer 110.

Referring still to FIGS. 1-5, the semiconductor device stack 120 may comprise a semiconductor device 140, a first electrode 130, and a second electrode 132. The semiconductor device 140 comprises a semiconductor material, such as, without limitation Si, GaAs, SiC, GaN, AlN, BN, diamond, or the like. As a non-limiting example, the semiconductor material may be a wide bandgap semiconductor material, for example, any semiconductor material comprising a bandgap of about 3 eV or more. Example wide bandgap semiconductor materials include SiC, GaN, AN, BN, and diamond. In some embodiments, the semiconductor device 140 may comprise an insulated-gate bi-polar transistor ("IGBT"), a metal-oxide-semiconductor field-effect transistor ("MOSFET") or any other semiconductor device. Further, as a non-limiting example, the semiconductor device 140 may operate at temperatures between about 150° C. and about 350° C. It should be understood that other operation temperatures are possible.

As depicted in FIGS. 2-5, the semiconductor device 140 comprises a first device surface 142 and a second device surface 144, which may be opposite the first device surface 142. When positioned in the semiconductor device stack 120, the first device surface 142 faces the first electrode 130, for example, in contact with and/or coupled to the first electrode 130, such that the first electrode 130 is positioned between the substrate layer 110 and the semiconductor device 140. Further, the second device surface 144 may face the second electrode 132, for example, in contact with and/or coupled to, such that the second electrode 132 is positioned opposite the first electrode 130.

Referring still to FIGS. 2-5, the semiconductor device 140 comprises a semiconductor substrate layer 146, for example an n+ layer, a semiconductor drift layer 148, for example, an n− layer and a substrate-drift interface 145, which is an interface between the semiconductor substrate layer 146 and the semiconductor drift layer 148. The semiconductor substrate layer 146 extends from the first device surface 142 to the substrate-drift interface 145 and the semiconductor drift layer 148 extends from the substrate-drift interface 145 toward the second device surface 144. As one non-limiting example, the semiconductor drift layer 148 may extend from the substrate-drift interface 145 to the second device surface 144, terminating at the second device surface 144. As another non-limiting example, the semiconductor drift layer 148 may extend from the substrate-drift interface 145 to another layer of the semiconductor device 140, for example one or more p type semiconductor layers, for example, a p+ layer, a p− layer, or the like. In some embodiments, the semiconductor substrate layer 146 may comprise a height extending in a direction between the first device surface 142 and the second device surface 144 of between about 50 μm and about 750 μm, for example, about 75 μm, 100 μm, 150 μm, 200 μm, 250 μm, 300 μm, 350 μm, 400 μm, 500 μm, 600 μm, or the like.

Referring again to FIGS. 1-5, the first electrode 130 and the second electrode 132 are each thermally coupled to the semiconductor device 140. Further, the first electrode 130 and the second electrode 132 are each electrically coupled to the semiconductor device 140 such that an electrical current pathway is formed between the first electrode 130 and the second electrode 132, extending through the semiconductor device 140, for example, a vertical electrical current pathway. In some embodiments, the first electrode 130 comprises a drain electrode and the second electrode 132 comprises a source electrode such that a vertical current pathway extends through the semiconductor device 140 from the source electrode to the drain electrode and, in operation, electrical current flows from the second electrode 132 to the first electrode 130. In other embodiments, the first electrode 130 comprises a source electrode and the second electrode 132 comprises a drain electrode such that, in operation, electrical current flows from the first electrode 130 to the second electrode 132. The first and second electrodes 130, 132 may comprise any electrically conductive material such as, without limitation, copper, copper oxide, graphite, brass, silver, platinum, or the like.

In some embodiments, the first electrode 130 may comprise a discrete metal layer that is bonded to the first device surface 142 and in other embodiments the first electrode 130 may comprise a metallization layer that is deposited onto the first device surface 142 using any known or yet to be developed deposition process, for example, electroplating, physical vapor deposition, chemical vapor deposition, laser metal deposition, or any other known or yet to be developed deposition process. In some embodiments, the first electrode 130 is also coupled to the device facing surface 116 of the substrate layer 110, for example, bonded to the device facing surface 116. Further, additional component layers may be positioned between the first electrode 130 and the device facing surface 116 of the substrate layer 110. Further, in some embodiments, the second electrode 132 may comprise a discrete metal layer that is bonded to the second device surface 144 and in other embodiments the second electrode 132 may comprise a metallization layer that is deposited onto the second device surface 144 using any known or yet to be developed deposition process, such as the deposition processes described above. Moreover, in some embodiments, one of the first and second electrodes 130, 132 may comprise a direct current (DC) electrode, for example a DC+ electrode or a DC- electrode, and the other of the first and second electrodes 130, 132 may comprise an alternating current (AC) electrode.

As depicted in FIGS. 1-5, the power electronics assembly 100 may further comprise one or more busbars electrically coupled to the semiconductor device stack 120. The one or more busbars may include a power busbar 190 electrically coupled to the semiconductor device stack 120, for example, electrically coupled to the second electrode 132 using a first electrical wire 191. The one or more busbars may also include a signal busbar 192 electrically coupled to the semiconductor device stack 120, for example, electrically coupled to the second electrode 132 using a second electrical wire 193. While the power busbar 190 and the signal busbar 192 are depicted in electrical engagement with the second electrode 132, it should be understood that the power busbar 190 and the signal busbar 192 may be electrically coupled to any component of the semiconductor device stack 120.

In operation, the power busbar 190 may output a power signal receivable by the semiconductor device stack 120 to power the semiconductor device stack 120. Further, the signal busbar 192 may output a control signal receivable by the semiconductor device stack 120 to control the operation of the semiconductor device 140, e.g., the switching operation of the semiconductor device 140. In some embodiments, the power busbar 190 and the signal busbar 192 may each comprise through-silicon vias configured to connect multiple semiconductor device stacks 120.

Referring now to the cross-sectional views of FIGS. 2-5, the integrated fluid channel system 150 comprises a plurality of cooling channels extending between the substrate inlet port 112 and the substrate outlet port 114 of the substrate layer 110. The plurality of cooling channels extend into the substrate layer 110 and may further extend into some or all of the components of the semiconductor device stack 120, for example, into the semiconductor device 140 and the first electrode 130. As depicted in FIGS. 2-5, the integrated fluid channel system 150 includes a substrate fluid inlet channel 152 extending from the substrate inlet port 112 into the substrate layer 110 and a substrate fluid outlet channel 154 extending from the substrate outlet port 114 into the substrate layer 110. The substrate fluid inlet channel 152 extends between the substrate inlet port 112 and the device facing surface 116 of the substrate layer 110. Further, the substrate fluid outlet channel 154 extends between the substrate outlet port 114 and the device facing surface 116 of the substrate layer 110 at a position along the device facing surface 116 of the substrate layer 110 at a location apart from the substrate inlet port 112. Non-limiting example power electronics assemblies and integrated fluid channel systems are described in U.S. application Ser. No. 15/175,622 titled "Power Electronics Assemblies Having a Semiconductor Cooling Chip and an Integrated Fluid Channel System," filed Jun. 7, 2016, and U.S. application Ser. No. 15/175,674 titled "Power Electronics Assemblies having a Wide Bandgap Semiconductor Device and an Integrated Fluid Channel System," filed Jun. 7, 2016, which are hereby incorporated by reference.

As depicted in FIGS. 2-5, one or more semiconductor fluid channels 160 are located in the semiconductor device 140 and are positioned in fluid communication with the substrate fluid inlet channel 152 and the substrate fluid outlet channel 154. The one or more semiconductor fluid channels 160 may be positioned in the semiconductor substrate layer 146 of the semiconductor device 140, for example, extending into the first device surface 142. The one or more semiconductor fluid channels 160 extend into the semiconductor device 140 from the first device surface 142 to a termination location 165 located within the semiconductor device 140, for example, located within the semiconductor substrate layer 146. Further, the distance between the termination location 165 and the first device surface 142 is a channel height 12. The channel height 12 may be between about 10 μm and about 500 μm, for example, about 25 μm, 50 μm, 100 μm, 150 μm, 200 μm, 250 μm, 300 μm, 400 μm, or the like. Moreover, the channel height 12 of the one or more semiconductor fluid channels 160 may be variable. As one non-limiting example, the channel height 12 of an individual semiconductor fluid channel 160 may vary along a fluid pathway of the individual semiconductor fluid channel 160. As another non-limiting example, in embodiments comprising multiple semiconductor fluid channels 160, individual semiconductor fluid channels 160 may comprise different channel heights 12.

While not depicted in FIGS. 2-5, the one or more semiconductor fluid channels 160 may alternatively or additionally be positioned in the semiconductor drift layer 148 or in any other layer of the semiconductor device 140. Moreover, while not depicted in FIGS. 2-5, the one or more semiconductor fluid channels 160 may extend into the second device surface 144 and in some embodiments, the one or more semiconductor fluid channels 160 may extend through the semiconductor device 140 from the first device surface 142 to the second device surface 144, for example, extending through both the semiconductor substrate layer 146, the semiconductor drift layer 148 and any additional semiconductor layers positioned between the first device surface 142 and the second device surface 144.

Figure 2:
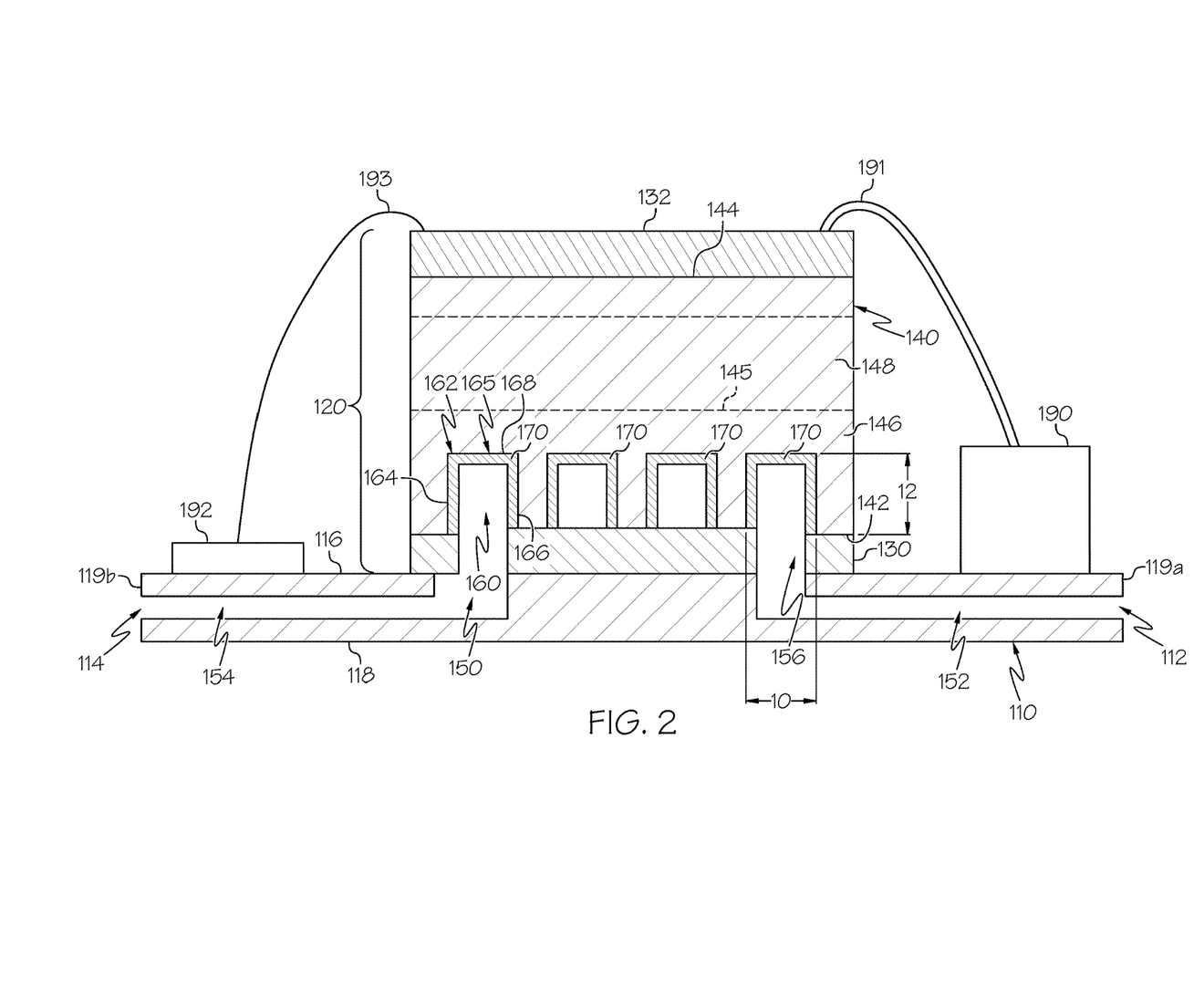
FIG. 2 depicts a cross section of the example power electronics assembly of FIG. 1 having an example integrated fluid channel system extending into a semiconductor device, according to one or more embodiments shown and described herein.
Figure 3:
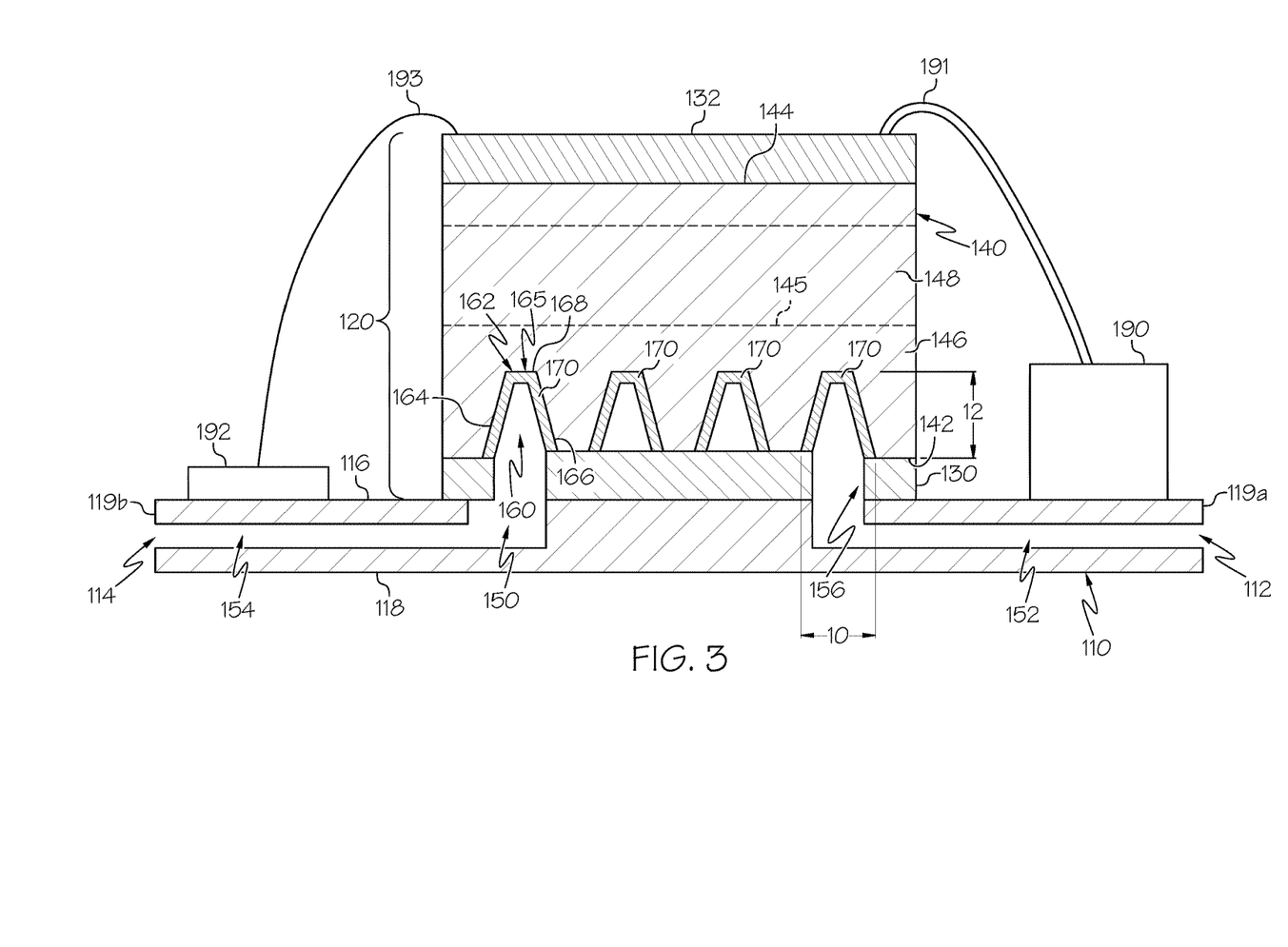
FIG. 3 depicts a cross section of the example power electronics assembly of FIG. 1 having another example integrated fluid channel system extending into a semiconductor device, according to one or more embodiments shown and described herein.
Figure 4:
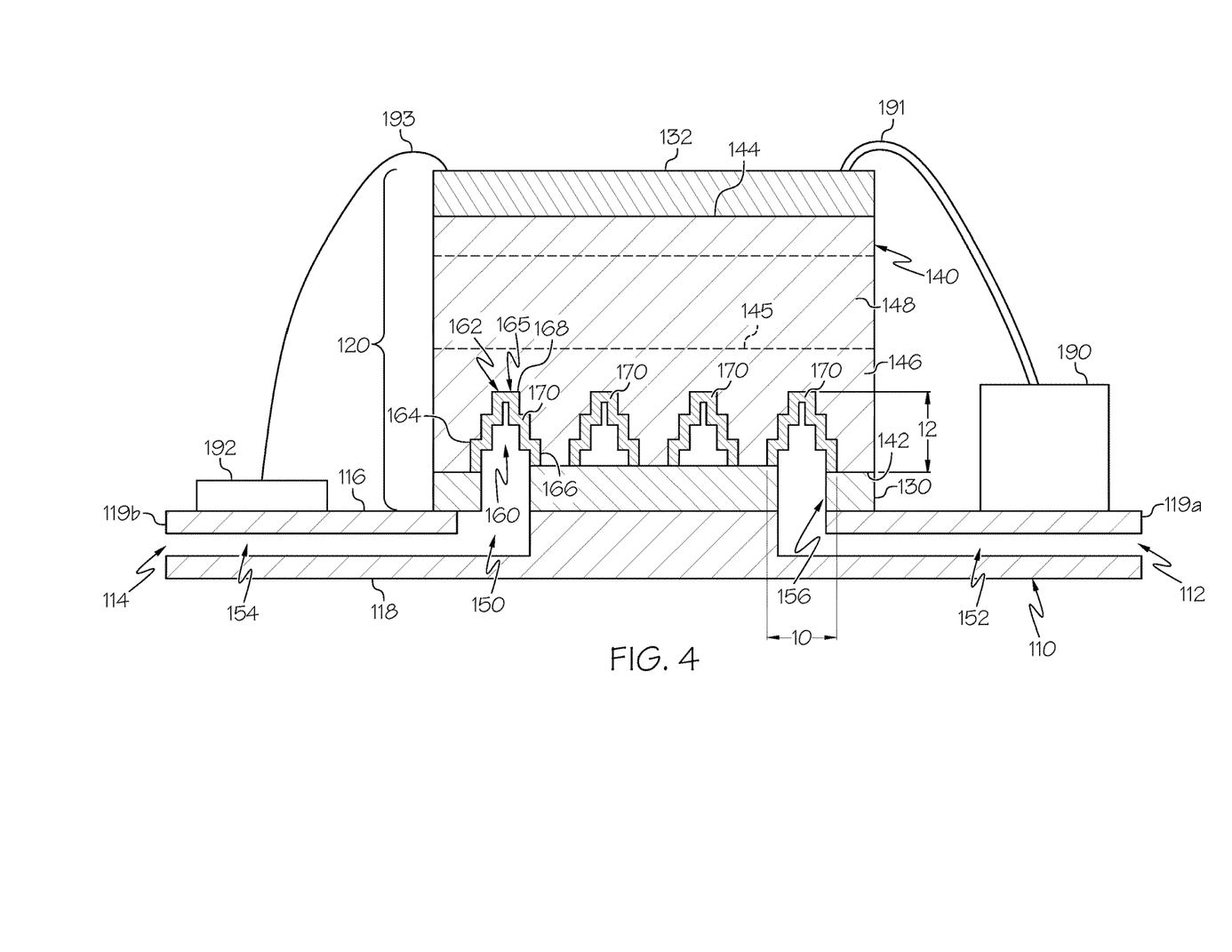
FIG. 4 depicts a cross section of the example power electronics assembly of FIG. 1 having yet another example integrated fluid channel system extending into a semiconductor device, according to one or more embodiments shown and described herein.
Figure 5:
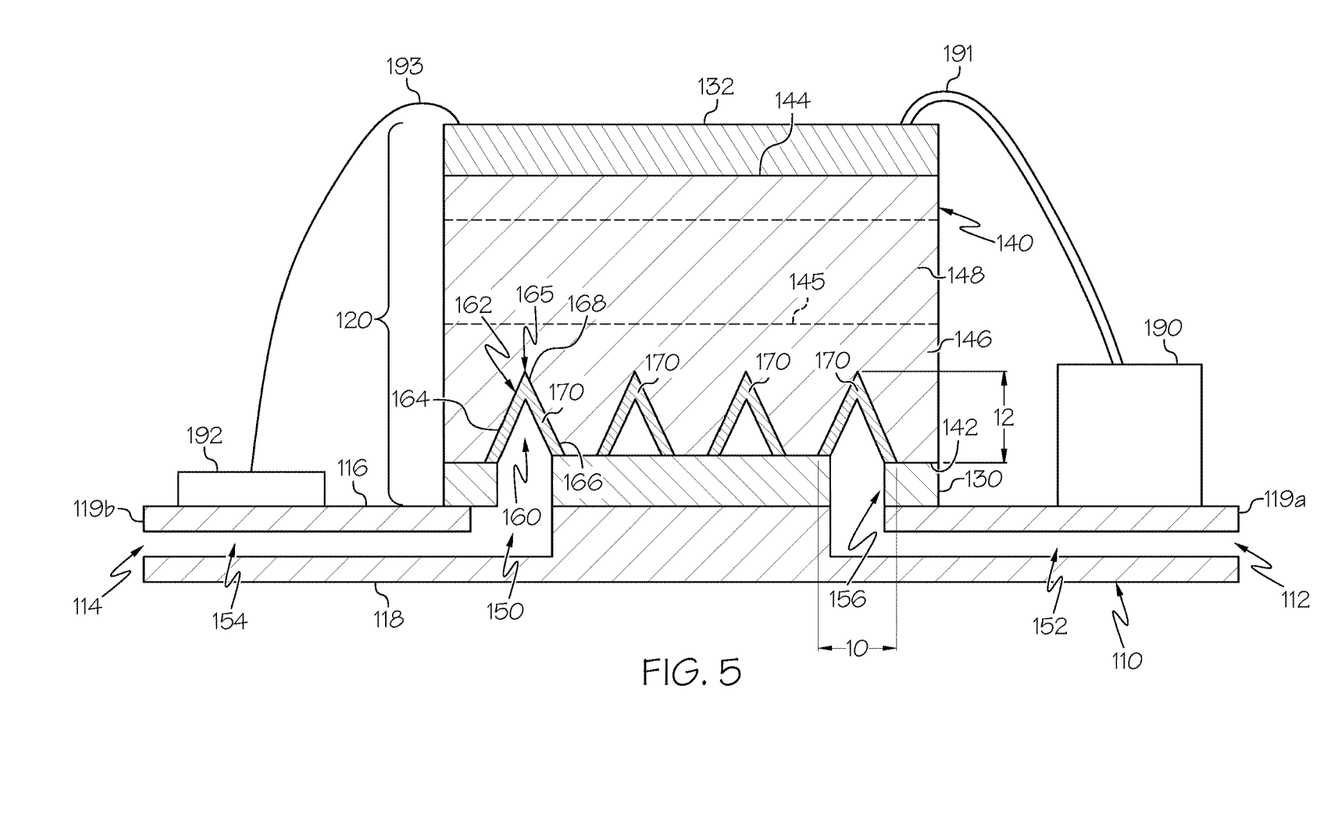
FIG. 5 depicts a cross section of the example power electronics assembly of FIG. 1 having still another example integrated fluid channel system extending into a semiconductor device, according to one or more embodiments shown and described herein.

Referring again to FIGS. 2-5, the one or more semiconductor fluid channels 160 comprise an inner surface 162 having a first wall portion 164, a second wall portion 166, and in some embodiments, a base portion 168 extending between the first wall portion 164 and the second wall portion. The base portion 168 may be collocated with the termination location 165. Further, the first wall portion 164 is spaced apart from the second wall portion 166 by a channel width 10. The channel width 10 may comprise between about 1 µm and about 300 µm, for example, about 10 µm, 25 µm, 50 µm, 75 µm, 100 µm, 150 µm, 200 µm, 250 µm, or the like. In some embodiments, as depicted in FIG. 2, the channel width 10 is uniform along the channel height 12 of the one or more semiconductor fluid channels 160 between the first device surface 142 and the termination location 165. In other embodiments, as depicted in FIGS. 3-5, the channel width 10 is not uniform along the channel height 12 of the one or more semiconductor fluid channels 160 between the first device surface 142 and the termination location 165. For example, as depicted in FIGS. 3-5, the channel width 10 at the first device surface 142 may be larger than the channel width 10 at the termination location 165 and may increase between from the termination location 165 and first device surface 142.

Further, in some embodiments, as depicted in FIG. 5, the one or more semiconductor fluid channels 160 may not comprise a base portion 168 and instead the first wall portion 164 may directly intersect with the second wall portion 166 at the termination location 165. Moreover, in some embodiments, the one or more semiconductor fluid channels 160 may extend through an array of fins, for example, pin fins, channel fins, or the like which collectively define at least a portion of the fluid flowpath of the one or more semiconductor fluid channels 160. For example, the array of fins may define the inner surfaces 162 of the one or more semiconductor fluid channels 160. Further, the one or more semiconductor fluid channels 160 may comprise straight channels, wavy channels, or channels comprising any arbitrarily designed cavities. Moreover, in some embodiments, the cross sectional shape of each semiconductor fluid channel 160 may be uniform along the first device surface 142 of the semiconductor device 140.

Referring still to FIGS. 2-5, the one or more semiconductor devices 140 may comprise a fluid channel metallization layer 170 positioned along the inner surface 162 of the one or more semiconductor fluid channels 160. The fluid channel metallization layer 170 may comprise, copper, copper oxide, graphite, brass, silver, platinum, or any other metal or metal oxide. Further, the fluid channel metallization layer 170 may comprise a uniform thickness along the inner surface 162, for example, a thickness of between about 0.1 µm and about 10 µm, for example 0.5 µm, 1 µm, 2 µm, 3 µm, 5 µm, 8 µm, or the like. Further, in some embodiments, the thickness of the fluid channel metallization layer 170 may be between about 1 µm and about 3 µm. In some embodiments, the fluid channel metallization layer 170 is positioned along the inner surface 162 of the one or more semiconductor fluid channels 160 using a deposition process, for example, electroplating, physical vapor deposition, chemical vapor deposition, laser metal deposition, or any other known or yet to be developed deposition process. In other embodiments, the fluid channel metallization layer 170 is positioned along the inner surface 162 of the one or more semiconductor fluid channels 160 using a bonding process, for example, by adhering, sintering, brazing, solder bonding, direct bonding, diffusion bonding, transient liquid phase bonding (TLP), or any other known or yet to be developed bonding processes In operation, the fluid channel metallization layer 170 may reduce the electrical on-resistance of the semiconductor device 140, for example, the electrical on-resistance applied by the semiconductor device 140 to the vertical current pathway extending between the first electrode 130 and the second electrode 132, for example, extending from the second electrode 132 (source electrode) to the first electrode 130 (drain electrode). For example, the electrical on-resistance applied by the semiconductor device 140 to the vertical current pathway extending between the source electrode and the drain electrode is less than about 1 mΩ-cm$^2$, for example, 0.75 mΩ-cm$^2$, 0.5 mΩ-cm$^2$, 0.4 mΩ-cm$^2$, 0.3 mΩ-cm$^2$, 0.2 mΩ-cm$^2$, 0.1 mΩ-cm$^2$, or the like. As a comparative example, the electrical on-resistance applied by an example semiconductor device without one or more semiconductor fluid channels 160 to the vertical current pathway extending between the source electrode and the drain electrode may comprise about 0.25 mΩ-cm$^2$.

As one non-limiting example, an example semiconductor device 140 comprising one or more semiconductor fluid channels 160 having the fluid channel metallization layer 170 positioned along the inner surface 162 of the one or more semiconductor fluid channels 160 may comprise an electrical on-resistance that is between about 5% and about 50% of the electrical on-resistance of a similar semiconductor device the includes one or more semiconductor fluid channels 160 that does not include the fluid channel metallization layer 170, for example, 10%, 15%, 20%, 25%, 30%, 40%, or the like. By decreasing the electrical on-resistance caused by the one or more semiconductor fluid channels 160, the fluid channel metallization layer 170 may improve electrical performance of the semiconductor device 140. In particular, the fluid channel metallization layer 170 allows the semiconductor device 140 to operate with an electrical on-resistance similar to and in some embodiments, better than the electrical on-resistance of an example semiconductor device without one or more semiconductor fluid channels 160. For example, the electrical on-resistance applied by the semiconductor device 140 comprising the one or more semiconductor fluid channels 160 and the fluid channel metallization layer 170 may be less than about 0.25 mΩ-cm$^2$. Thus, in operation, the semiconductor device 140 comprising the one or more semiconductor fluid channels 160 and the fluid channel metallization layer 170 have improved cooling without diminished electrical performance.

Referring still FIGS. 2-5, the integrated fluid channel system 150 may further comprise one or more electrode fluid channels 156 extending within the first electrode 130. The one or more electrode fluid channels 156 may extend between the substrate fluid inlet channel 152 and the one or more semiconductor fluid channels 160 and between the substrate fluid outlet channel 154 and the one or more semiconductor fluid channels 160 such that the one or more electrode fluid channels 156 are in fluid communication with the substrate fluid inlet channel 152, the substrate fluid outlet channel 154, and the one or more semiconductor fluid channels 160. In some embodiments, at least a portion of the electrode fluid channels 156 extend within the first electrode 130 such that the electrode fluid channels 156 are encircled by the first electrode 130. Further, in some embodiments, one or more electrode fluid channels 156 may also extend within the second electrode 132, for example, in embodiments in which the semiconductor fluid channels 160 extend through the semiconductor device 140, such that electrode fluid channels 156 within the second electrode 132 are in fluid communication with the semiconductor fluid channels 160 and the electrode fluid channels 156 within the first electrode 130.

Referring again to FIG. 1, the power electronics assembly 100 may further comprise a cooling fluid reservoir 180, a fluid pump 182, and a secondary heat exchanger 186, each fluidly coupled to the substrate inlet port 112 and the substrate outlet port 114. For example, a coolant pipe system 184 may extend between and fluidly couple the substrate inlet port 112 and the substrate outlet port 114 with each of the cooling fluid reservoir 180, the fluid pump 182, and the secondary heat exchanger 186, and also fluidly couple the cooling fluid reservoir 180 with both the fluid pump 182 and the secondary heat exchanger 186. The cooling fluid reservoir 180 may house dielectric cooling fluid. Further, the fluid pump 182 may pump the dielectric coolant fluid through the integrated fluid channel system 150. For example, the fluid pump 182 may pump the dielectric coolant fluid from the cooling fluid reservoir 180 and the substrate inlet port 112 through the integrated fluid channel system 150 and from the substrate outlet port 114 to the secondary heat exchanger 186 and the cooling fluid reservoir 180. In operation, the secondary heat exchanger 186 may remove heat collected by the dielectric cooling fluid before the dielectric cooling fluid enters the cooling fluid reservoir 180.

In operation, dielectric cooling fluid may be introduced into the substrate inlet port 112, for example, dielectric cooling fluid pumped from the cooling fluid reservoir 180 into the substrate inlet port 112 using the fluid pump 182. The dielectric cooling fluid may flow from the substrate inlet port 112 through the substrate fluid inlet channel 152 and into one or more cooling channels of the semiconductor device stack 120, for example, the electrode fluid channels 156 and the one or more semiconductor fluid channels 160, which each provide a fluid pathway such that coolant fluid flowing therethrough may remove heat from the semiconductor device stack 120, for example, heat generated by the semiconductor device 140. Next, the dielectric cooling fluid may flow from the one or more cooling channels positioned in the semiconductor device stack 120 into the substrate fluid outlet channel 154 and exit the substrate outlet port 114.

Referring again to FIGS. 1-5, a method of manufacturing the power electronics assembly 100 is described. While the method is described below in a particular order, it should be understood that other orders are contemplated. In embodiments comprising the one or more semiconductor fluid channels 160, the method may first comprise etching the one or more semiconductor fluid channels 160 into the semiconductor device 140, for example, using any known or yet to be developed methods of etching semiconductor materials, such as dry etching, wet etching, or the like. Next, the method comprises disposing the fluid channel metallization layer 170 onto the inner surface 162 of the one or more semiconductor fluid channels 160.

In some embodiments, the fluid channel metallization layer 170 may be disposed onto the inner surface 162 of the one or more semiconductor fluid channels 160 by coupling the fluid channel metallization layer 170 onto the inner surface 162, for example, by adhering, sintering, brazing, solder bonding, direct bonding, diffusion bonding, transient liquid phase bonding (TLP), or any other known or yet to be developed bonding processes. In other embodiments, the fluid channel metallization layer 170 may be deposited onto the inner surface 162 of the one or more semiconductor fluid channels 160, for example, by electroplating, physical vapor deposition, chemical vapor deposition, laser metal deposition, or any other known or yet to be developed deposition process. Next, in embodiments comprising the one or more electrode fluid channels 156, the method includes forming the one or more electrode fluid channels 156 in the first electrode 130 the second electrode 132, or both, for example, by etching or otherwise machining the one or more electrode fluid channels 156 into the first electrode 130, the second electrode 132, or both.

Referring still to FIGS. 1-5, the method of manufacturing the power electronics assembly 100 may next comprise coupling or otherwise positioning the first device surface 142 of the semiconductor device 140 onto the first electrode 130. In embodiments comprising the one or more semiconductor fluid channels 160 and the one or more electrode fluid channels 156, coupling or otherwise positioning the first device surface 142 of the semiconductor device 140 onto the first electrode 130 may position the one or more semiconductor fluid channels 160 in fluid communication with the one or more electrode fluid channels 156. In some embodiments, the first device surface 142 of the semiconductor device 140 may be coupled to the first electrode 130 by sintering, brazing, solder bonding, direct bonding, diffusion bonding, transient liquid phase bonding (TLP), or any other known or yet to be developed bonding processes. In other embodiments, the first electrode 130 may comprise a metallization layer and the first electrode 130 may be coupled to the first device surface 142 of the semiconductor device 140 by depositing the first electrode 130 onto the first device surface 142 of the semiconductor device 140, for example, using any of the deposition processes described above.

Referring still to FIGS. 1-5, in embodiments comprising the electrode fluid channels 156, the method may further comprise positioning the first electrode 130 into fluid communication with the substrate layer 110, such that the substrate fluid inlet channel 152 and the substrate fluid outlet channel 154 are each in fluid communication with the one or more electrode fluid channels 156 and the one or more semiconductor fluid channels 160. In some embodiments, the method may further comprise coupling the first electrode 130 to the device facing surface 116 of the substrate layer 110, for example, using any bonding process, such as, the bonding processes described above, or any deposition process, such as the deposition processes described above. Additionally, the method includes bonding the second electrode 132 to the second device surface 144 of the semiconductor device 140, for example, using any bonding process, such as, the bonding processes described above, or any deposition process, such as the deposition processes described above.

It should now be understood that the embodiments described herein may be directed to power electronics assemblies that include a substrate layer, a semiconductor device, one or more electrodes electrically coupled to the semiconductor device, and an integrated fluid channel system comprising semiconductor fluid channels extending within at least the semiconductor device. Further, fluid channel metallization layers may be positioned along inner surfaces of the semiconductor fluid channels. In operation, dielectric cooling fluid may be circulated through the integrated fluid channel system to remove heat from the semiconductor device. The semiconductor fluid channels positioned directly within the semiconductor device facilitate heat removal at the heat source, for example, the semiconductor device, lowering the thermal resistance created by intervening structure between the heat source and the dielectric cooling fluid. Moreover, the fluid channel metallization layer may lower the electrical on-resistance within the semiconductor device caused by the semiconductor fluid channels, maintaining or even improving the electrical performance of the semiconductor device while simultaneously improving heat removal from the semiconductor device.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A power electronics assembly comprising:
a power electronic semiconductor-device comprising:
a first device surface opposite a second device surface;
a semiconductor substrate layer extending from the first device surface to a substrate-drift interface;
a semiconductor drift layer extending from the substrate-drift interface towards the second device surface; and
a semiconductor fluid channel positioned within the semiconductor substrate layer of the power electronic semiconductor device, wherein the semiconductor fluid channel is in fluid communication with an inlet port and an outlet port such that a fluid pathway is formed from the inlet port to the outlet port through the semiconductor fluid channel and the semiconductor fluid channel comprises an inner surface; and
a fluid channel metallization layer positioned along the inner surface of the semiconductor fluid channel.

2. The power electronics assembly of claim 1, wherein:
the semiconductor fluid channel extends from the first device surface of the power electronic semiconductor device to a termination location located within the semiconductor substrate layer of the power electronic semiconductor device; and
the inner surface of the semiconductor fluid channel comprises a first wall portion and a second wall portion spaced apart from the first wall portion by a channel width.

3. The power electronics assembly of claim 2, wherein the channel width between the first wall portion and the second wall portion is uniform between the first device surface and the termination location.

4. The power electronics assembly of claim 2, wherein the channel width between the first wall portion and the second wall portion at the first device surface is larger than the channel width between the first wall portion and the second wall portion at the termination location.

5. The power electronics assembly of claim 1, wherein the fluid channel metallization layer comprises a uniform thickness along the inner surface.

6. The power electronics assembly of claim 1, wherein the fluid channel metallization layer comprises a thickness of between about 1 µm and about 3 µm.

7. The power electronics assembly of claim 1, further comprising:
a first electrode electrically and thermally coupled to the first device surface of the power electronic semiconductor device, and
a second electrode electrically and thermally coupled to the second device surface of the power electronic semiconductor device.

8. The power electronics assembly of claim 7, wherein the first electrode comprises a drain electrode and the second electrode comprises a source electrode each thermally and electrically coupled to the power electronic semiconductor device such that a vertical current pathway extends through the power electronic semiconductor device from the source electrode to the drain electrode.

9. The power electronics assembly of claim 7 wherein an electrical on-resistance applied by the power electronic semiconductor device to the vertical current pathway extending between the second electrode and the first electrode is less than about 1 mΩ-cm$^2$.

10. The power electronics assembly of claim 1, wherein the power electronic semiconductor device is a wide bandgap semiconductor device comprising a wide bandgap semiconductor material.

11. A power electronics assembly comprising:
a semiconductor device stack comprising:
a power electronic semiconductor device;
a first electrode electrically and thermally coupled to a first device surface of the power electronic semiconductor device; and
a second electrode electrically and thermally coupled to a second device surface of the power electronic semiconductor device;
a substrate layer coupled to the semiconductor device stack, wherein the substrate layer comprises a substrate inlet port and a substrate outlet port;
an integrated fluid channel system extending between the substrate inlet port and the substrate outlet port of the substrate layer, wherein the integrated fluid channel system comprises:
a substrate fluid inlet channel extending from the substrate inlet port into the substrate layer;
a substrate fluid outlet channel extending from the substrate outlet port into the substrate layer; and
a semiconductor fluid channel extending into the power electronic semiconductor device and positioned in fluid communication with the substrate fluid inlet channel and the substrate fluid outlet channel, wherein the semiconductor fluid channel comprises an inner surface; and a fluid channel metallization layer positioned along the inner surface of the semiconductor fluid channel of the power electronic semiconductor device.

12. The power electronics assembly of claim 11, wherein the substrate layer is coupled to the semiconductor device stack such that the first electrode is positioned between the substrate layer and the power electronic semiconductor device.

13. The power electronics assembly of claim 11, wherein the integrated fluid channel system further comprises one or more electrode fluid channels extending within the first electrode, wherein the one or more electrode fluid channels are in fluid communication with the substrate fluid inlet channel, the substrate fluid outlet channel, and the semiconductor fluid channel.

14. The power electronics assembly of claim 11, wherein:
the first device surface of the power electronic semiconductor device is opposite the second device surface of the power electronic semiconductor device;
the first electrode comprises a drain electrode;
the second electrode comprises a source electrode; and
the first electrode and the second electrode are each thermally and electrically coupled to the power electronic semiconductor device such that a vertical current pathway extends through the power electronic semiconductor device from the second electrode to the first electrode.

15. The power electronics assembly of claim 14 wherein an electrical on-resistance applied by the power electronic semiconductor device to the vertical current pathway extending between the second electrode and the first electrode is less than about 1 $m\Omega\text{-}cm^2$.

16. The power electronics assembly of claim 11, further comprising a cooling fluid reservoir, a fluid pump, and a secondary heat exchanger, each fluidly coupled to the substrate inlet port and the substrate outlet port, wherein the cooling fluid reservoir houses a dielectric cooling fluid.

* * * * *

UNITED STATES PATENT AND TRADEMARK OFFICE
CERTIFICATE OF CORRECTION

PATENT NO. : 10,121,729 B2
APPLICATION NO. : 15/218801
DATED : November 6, 2018
INVENTOR(S) : Ercan M. Dede, Kyosuke Miyagi and Yuji Fukuoka It is certified that error appears in the above-identified patent and that said Letters Patent is hereby corrected as shown below:

In the Specification

In Column 04, Line 29, after "GaN," delete "AN" and insert --AlN--, therefor.

Signed and Sealed this
Twenty-second Day of January, 2019

Andrei Iancu
*Director of the United States Patent and Trademark Office*